US008887980B2

(12) United States Patent
Kurata et al.

(10) Patent No.: US 8,887,980 B2
(45) Date of Patent: Nov. 18, 2014

(54) METHOD OF SOLDERING PORTIONS PLATED BY ELECTROLESS NI PLATING

(75) Inventors: Ryoichi Kurata, Tochigi (JP); Daisuke Soma, Tochigi (JP); Hiroshi Okada, Moka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 868 days.

(21) Appl. No.: 11/921,861

(22) PCT Filed: Jun. 10, 2005

(86) PCT No.: PCT/JP2005/010660
§ 371 (c)(1),
(2), (4) Date: Mar. 13, 2009

(87) PCT Pub. No.: WO2006/131979
PCT Pub. Date: Dec. 14, 2006

(65) Prior Publication Data
US 2009/0218387 A1    Sep. 3, 2009

(51) Int. Cl.
*B23K 31/02* (2006.01)
*C22C 13/00* (2006.01)
*B23K 35/26* (2006.01)
*H05K 3/34* (2006.01)
*H05K 3/24* (2006.01)

(52) U.S. Cl.
CPC ............ *B23K 35/262* (2013.01); *H05K 3/3463* (2013.01); *H05K 3/244* (2013.01); *H05K 2201/10734* (2013.01); *H05K 2203/072* (2013.01)
USPC ..................... 228/123.1; 228/122.1; 228/256; 420/557; 420/560

(58) Field of Classification Search
USPC .......................... 228/203, 245, 246, 249, 256
See application file for complete search history.

(56) References Cited

U.S. PATENT DOCUMENTS

| | | | |
|---|---|---|---|
| 2003/0021718 A1* | 1/2003 | Munekata et al. | 420/560 |
| 2003/0193094 A1* | 10/2003 | Takahashi et al. | 257/780 |
| 2004/0262779 A1* | 12/2004 | Amagai et al. | 257/779 |

FOREIGN PATENT DOCUMENTS

| | | |
|---|---|---|
| EP | 1382413 | 7/2003 |
| EP | 1402988 | 9/2003 |
| EP | 1410871 | 10/2003 |
| JP | 11000791 | 1/1999 |
| JP | 2000015479 | 1/2000 |
| JP | 2002327279 | 11/2002 |
| JP | 2002336988 | 11/2002 |

(Continued)

OTHER PUBLICATIONS

"Reliability study of the electroless Ni—P layer against solder alloy" by M. O. Alam et al, from Microelectronics Reliability, vol. 42, No. 7 (Jul. 1, 2002), pp. 1065-1073, XP-002552005, Elsevier BV.

*Primary Examiner* — Aaron Austin
*Assistant Examiner* — Megha Mehta
(74) *Attorney, Agent, or Firm* — Michael Tobias

(57) ABSTRACT

When electrodes of a BGA plated by electroless Ni plating are soldered with solder balls of a lead-free solder, peeling of soldered joints readily takes place under an external impact. When a BGA electrode plated by electroless Ni plating is soldered with a lead-free solder to which 0.03-0.1 mass percent of P is added, the growth of brittle SnNi intermetallic compounds formed on the portion being soldered and a P layer on the electroless Ni plating surface is suppressed, resulting in an increased bonding strength.

13 Claims, 3 Drawing Sheets

(56) References Cited

FOREIGN PATENT DOCUMENTS

| | | |
|---|---|---|
| JP | 2003311469 | 11/2003 |
| JP | 2003326386 | 11/2003 |
| JP | 2004141910 | 5/2004 |
| JP | 2004154864 | 6/2004 |
| WO | 2005035180 | 4/2005 |

* cited by examiner ns 1 METHOD OF SOLDERING PORTIONS PLATED BY ELECTROLESS NI PLATING

TECHNICAL FIELD

This invention relates to a soldering method which increases the bonding strength of soldering when portions which have been subjected to electroless Ni plating are soldered with a lead-free solder.

BACKGROUND ART

Portions to be soldered of electronic equipment are usually made of Cu. Cu is easily wet by molten solder, and it causes little occurrence of soldering defects such as unsoldered portions and voids when soldering is carried out. However, when portions being soldered made of Cu, such as electrodes of electronic parts such as BGA substrates, are left in the ambient air for a long period after manufacture of the electronic parts, the surface of the Cu is oxidized by the oxygen in the air or sulfurized by exhaust gas of automobiles using fossil fuels or by combustion gas resulting from heating by combustion of fossil fuels. If the Cu surface becomes coated with an oxide or sulfide film as a result of such oxidation or sulfurization, the surface becomes difficult to wet by molten solder at the time of soldering, resulting in the occurrence of soldering defects like those described above.

Therefore, it has been proposed from in the past to use Ni, which has inferior wettability by molten solder compared to Cu but which does not readily form oxides or sulfides when left in ambient air for a long period, for electrodes of electronic equipment. However, since Ni is more expensive than Cu, Ni is not used for entire electrodes and instead Ni is used to apply Ni plating to the surface of less expensive Cu electrodes.

Methods of applying Ni plating to a Cu surface include the electroplating method and the electroless plating method. In the electroplating method, an anode and a cathode are disposed in an electrolytic solution, and a metal plating layer is formed on the surface of the cathode by an electrolytic reaction. However, the electroplating method not only has problems such as the need for special wiring for the purpose of conducting electricity to portions being plated, restrictions on the current density for electrolysis, corrosion of metal portions in the plating apparatus, and the need to use a soluble anode, but it also has problems such as a slow deposition speed of Ni, decreased deposition in locations far from an anode or in recesses, and substantially no deposition of metal on the rear side of a cathode.

In contrast, the electroless plating method has the advantages that Ni plating of uniform thickness is formed over the entire surface of the material regardless of the type of material or its shape by simply immersing a material to be soldered in a plating solution without conduction of electricity. Accordingly, electroless plating is more frequently employed for Ni plating of electrodes of electronic equipment.

A plating solution used for electroless Ni plating is a Ni—P plating solution containing a combination of nickel sulfate as a source of Ni and sodium hypophosphite as a reducing agent. It also contains sodium hydroxide which is used is to maintain the pH of the plating solution constant. An electroless Ni plating layer with a thickness of approximately 0.5-10 μm which is formed with this Ni—P plating solution normally contains approximately 2-15 mass percent of P.

After a BGA substrate has been subjected to electroless Ni plating, solder bumps are formed on the electrodes of the substrate. The BGA substrate is then placed on a printed circuit board, and the bumps are melted to solder the BGA substrate to the printed circuit board. In order to form solder bumps on the BGA substrate, an adherent flux is first applied to the electrodes of the BGA substrate, solder balls are then placed atop the electrodes, and the BGA substrate is heated in a reflow furnace to melt the solder balls. The molten solder balls wet the electrodes of the BGA substrate and are soldered thereto to form solder bumps atop the electrodes. The electrodes of the BGA substrate have been treated in the manner described above with electroless Ni plating containing P. In addition, in most cases, Au flash plating (to a thickness of approximately 0.1-0.5 μm) is applied atop the electroless Ni plating in order to increase the affinity of the surface to solder, and thus the molten solder balls wet the electrodes without producing soldering defects.

In the past, solder used for forming solder bumps on BGA substrates was Pb—Sn solder. When Pb—Sn solder has a composition close to the eutectic composition, i.e., when its Sn content is in the vicinity of 63 mass percent, its melting point is a relatively low level of 183° C. Therefore, it produces little thermal effect on BGA substrates and elements inside the BGA substrates during heating at the time of solder bump formation in a reflow furnace or during heating at the time of subsequent soldering of the BGA substrate to a printed circuit board.

However, Pb—Sn solder contains Pb, which is harmful to the environment, so the use of Pb is not desirable.

Therefore, the use of Pb-containing solder has recently come to be regulated, and so-called lead-free solder which does not contain Pb at all is now being used. Lead-free solder has Sn as a main component, and it is used even for soldering of portions plated by electroless Ni plating.

The below-identified Patent Document 1 states that soldering to portions plated by electroless Ni plating with a lead-free solder has the problems that it results is in a decreased adhesive strength, that the Ni plating layer is dissolved and disappears when reflow is repeated, and that conventional Au flash plating has a plating thickness which is large and makes the adhesive strength inadequate. Therefore, that document proposes that electrodes to which electroless Ni plating has been applied be subjected to electroless gold plating to a thickness of 0.005-0.04 μm as a second metal plating.

Patent Document 1: JP H14-327279 A1

DISCLOSURE OF INVENTION

When a BGA substrate having solder bumps formed from a conventional lead-free solder on BGA electrodes plated by electroless Ni plating was mounted on a printed circuit board and incorporated into electronic equipment, the BGA substrate sometimes peeled off the printed circuit board.

For example, impacts are sometimes imparted to mobile phones, personal computers, and other electronic equipment such as when a mobile phone which has been placed into ones pocket falls from the pocket or a small notebook computer is placed into a bag and the bag is dropped while being carried. Such impacts also affect the operation of the electronic equipment. The impacts result in peeling of solder joints particularly in locations between the solder and the electronic parts, which causes failure of electrical conduction between BGA substrates and printed circuit boards in the electronic equipment and makes the electronic equipment entirely unable to function as intended.

As disclosed in Patent Document 1, the above-described problems can be solved by providing a thin layer of electroless gold plating as a second metal plating. However, this method not only increases material costs due to use of gold which is expensive, it also increases the number of plating steps by one and thus increases processing costs as well. Therefore, it cannot be described as a practical solution. In addition, this method is not satisfactory from the standpoint of providing sufficient bonding strength and impact strength of solder joints which is currently demanded.

The present inventors carried out diligent investigations concerning the cause of the ready occurrence of peeling when portions coated by electroless Ni plating are soldered with a lead-free solder. As a result, they found the following.

A lead-free solder with Sn as a main component contains a large amount of Sn, and its soldering temperature is higher than that of a Pb—Sn based solder. Therefore, the Ni in electroless Ni plating and the large amount of Sn in lead-free solder react to form a thick layer of a brittle SnNi intermetallic compound. At this time, Ni escapes from the surface of the electroless Ni plating while a large amount of P remains in the surface of the electroless Ni plating, thereby forming a P-enriched layer. The P-enriched layer remaining in the surface of the Ni plating is also brittle, and it causes the solder joint to become still more brittle and to easily peel off when combined with the growth of the reacted SnNi layer to a large thickness.

FIG. 1 is an electron photomicrograph of the structure of a conventional solder joint showing the above-described situation. In this figure, a Ni plating layer 1 formed by the electroless plating method is provided on the surface of a Cu electrode of a BGA substrate (not shown). A solder bump 5 is formed atop the Ni plating layer 1 by soldering with a solder ball of a Sn-4Ag-0.5Cu lead-free solder, resulting in the formation of a thick SnNi intermetallic compound layer 6 in the joining area between the electroless Ni plating layer 1 and the solder bump 5. In addition, a P-enriched layer 7 where a large amount of P remains due to Ni escaping from the electroless Ni plating layer exists between the intermetallic compound layer 6 and the electroless Ni plating layer 1. Thus, due to the presence of a brittle SnNi intermetallic compound layer 6 and a brittle P-enriched layer 7, when a portion plated by electroless Ni plating is soldered with a lead-free solder, peeling may easily occur if the resulting joint receives a large external impact.

The present inventors performed diligent research concerning suppressing the growth of a SnNi intermetallic compound layer 6 which is formed in a solder joint when a portion plated by electroless Ni plating is soldered with a lead-free solder having Sn as a main component, and suppressing the formation of a P-enriched layer 7 by making it difficult for Ni to escape from electroless Ni plating. As a result, they unexpectedly found that if a large amount of P is added to a lead-free solder having Sn as a main component, the growth of a SnNi intermetallic compound and escape of Ni from electroless Ni plating are suppressed, and they completed the present invention.

Namely, when soldering of a portion plated by electroless Ni plating is carried out at a soldering temperature of 250° C. for a soldering time of 40 seconds using a lead-free solder to which P is not added or to which less than 0.03 mass percent of P is added, a brittle SnNi intermetallic compound grows to a thickness of 1-2 μm. In contrast, in the present invention, by using a solder alloy containing at least 0.03 mass percent of P, the thickness of such an intermetallic compound can be made 0.5 μm or less, thereby making it possible to improve the impact resistance of the resulting joint.

A lead-free solder which has the effect of suppressing the growth of such an intermetallic compound when used for soldering of portions plated by electroless Ni plating is one for which the proportion of P compounds in solid phase at 250° C. is at most 0.2 mass percent of the solder. The P compounds are compounds which are formed by reaction with components in a lead-free solder.

The present invention is a soldering method of portions plated by electroless Ni plating characterized in that portions to be soldered which are plated by electroless Ni plating are soldered with a lead-free solder selected from a Sn—P—Ag based solder and a Sn—P—Cu based solder, the solder having Sn as a main component and containing 0.03-0.1 mass percent of P, thereby forming a soldered joint having an increased bonding strength.

According to the present invention, when portions to be soldered which have been subjected to electroless Ni plating are soldered with a lead-free solder, the thickness of a brittle SnNi intermetallic compound can be made small, and the thickness of a P-enriched layer on the surface of the electroless Ni plating can also be made small. Accordingly, in the present invention, the bonding strength of portions which have been subjected to electroless Ni plating can be sufficiently increased. Therefore, even when electronic equipment is subjected to a large external impact, soldered portions do not readily peel off, and soldered portions having excellent reliability are obtained.

BEST MODE FOR CARRYING OUT THE INVENTION

A lead-free solder suitable for use in the present invention is a Sn—P—Ag based solder or a Sn—P—Cu based solder. The desired effects can also be expected with a Sn—P—Zn based solder and a Sn—P—Sb based solder.

Here, "based solder" means not only ternary alloys constituted by the three indicated elements but also alloys in which other elements are added to these ternary alloys.

For example, Sn—P—Ag based alloys include Sn—P—Ag—Cu alloys, Sn—P—Ag—Cu—Ni alloys, Sn—P—Ag—Sb alloys, Sn—P—Ag—Ni alloys, Sn—P—Ag—In alloys, Sn—P—Ag—Bi alloys, Sn—P—Ag—Bi—In alloys, and the like. Sn—P—Cu based alloys include Sn—P—Cu—Ni alloys, Sn—P—Cu—In alloys, Sn—P—Cu—Bi alloys, Sn—P—Cu—In—Bi alloys, and the like. Sn—P—Zn based alloys include Sn—P—Zn—Ni alloys, Sn—P—Zn—Ag alloys, Sn—P—Zn—Sb alloys, Sn—P—Zn—In alloys, Sn—P—Zn—Bi alloys, and the like. Sn—P—Sb based alloys include Sn—P—Sb—Ag alloys, Sn—P—Sb—Cu alloys, Sn—P—Sb—In alloys, Sn—P—Sb—Ni alloys, and the like.

A lead-free solder used in the present invention has a liquidus temperature of at least 250° C., and the proportion of P compounds in solid phase at 250° C. is at most 0.2 mass percent of the solder. Namely, when soldering is carried out at 250° C. using this lead-free solder, even if compounds of P with an element of the lead-free solder exist in solid state in the molten solder up to about 0.2 mass percent of the solder, they do not in any way obstruct soldering.

Figure 1:
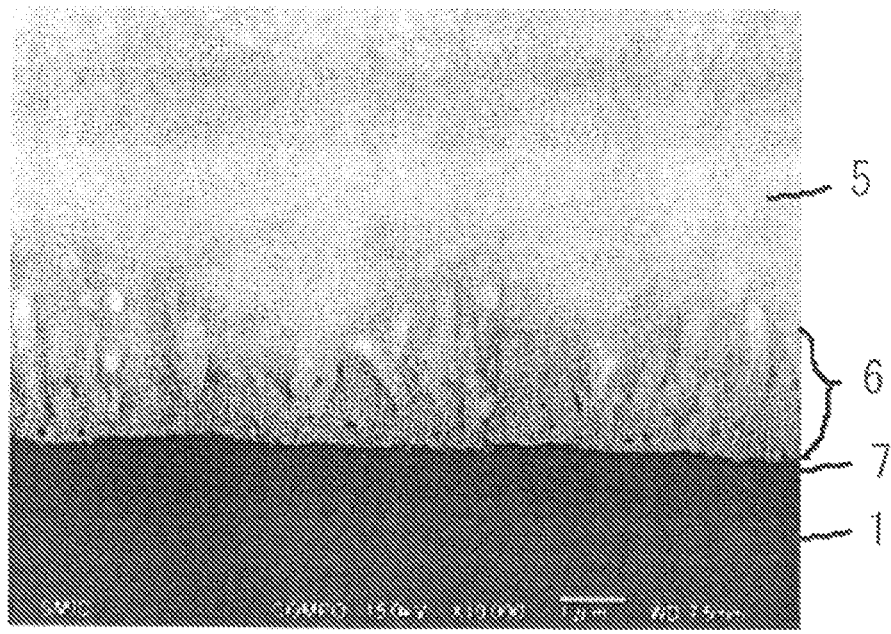
FIG. 1 is an electron photomicrograph of the structure of a cross section of a solder joint when a portion plated by electroless Ni plating was soldered with a conventional lead-free solder to which P was not added.
Figure 2:
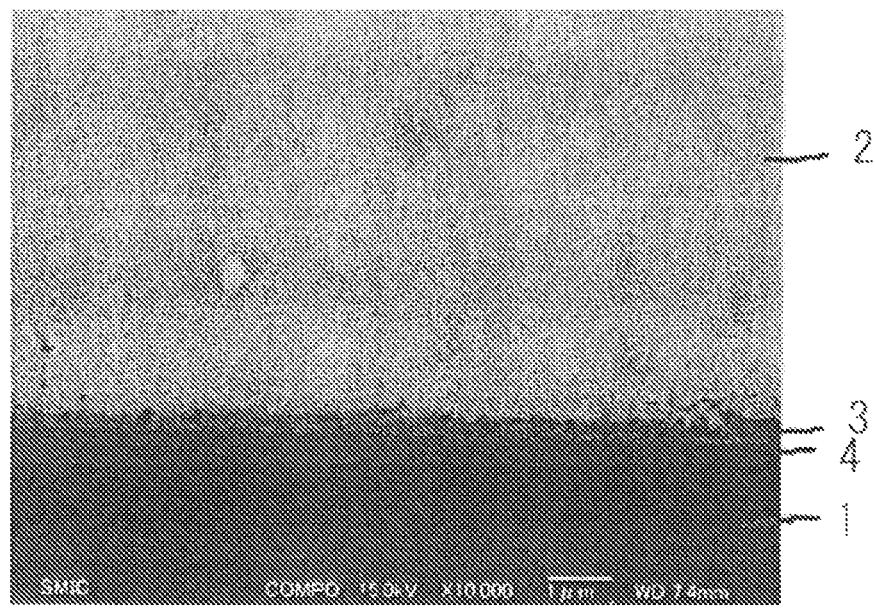
FIG. 2 is an electron photomicrograph of the structure of a cross section of a solder joint when a portion plated by electroless Ni plating was soldered with a lead-free solder according to the present invention to which a large amount of P was added.

FIG. 2 is an electron photomicrograph of the structure of a cross section of an example of a solder joint when soldering was carried out according to a below-described example of the present invention. In the figure, a Ni plating layer 1 which was formed by the electroless plating method is provided on the surface of a Cu electrode of a BGA substrate (not shown). A solder bump 2 is formed atop this Ni plating layer 1 by soldering with a solder ball of a Sn-0.03P-4Ag-0.5Cu lead-free solder, and the growth of a SnNi intermetallic compound layer 3 is suppressed in the joining area between the electroless Ni plating layer 1 and the solder bump 2. As a result, whereas in the past, a P-enriched layer 7 where Ni escaped from the electroless Ni plating while a large amount of P remained was present between the intermetallic compound layer 3 and the electroless Ni plating layer 1 as shown in above-described FIG. 1, according to the present invention, the presence of a P-enriched layer 4 becomes as small as possible since a SnNi intermetallic compound layer 3 does not grow. Therefore, even if a portion plated by electroless Ni plating is soldered with a lead-free solder, the resulting solder joint exhibits excellent bonding strength against large external impacts.

Although there is no particular restriction in the present invention on a means for carrying out electroless Ni plating, electroless plating can be performed using sodium hypophosphite as a reducing agent as in the past. The plating thickness can be the same as is conventional, and normally 0.5-10 μm is sufficient.

A lead-free solder used in the present invention is one having Sn as a main component to which various elements are added. Preferably it contains at least 80 mass percent of Sn. If the content of Sn is smaller than 80 mass percent, wettability with respect to portions plated by electroless Ni plating becomes poor. If the amount of P added to a lead-free solder having Sn as a main component is smaller than 0.03 mass percent, the effect of suppressing growth of SnNi intermetallic compounds and the effect of suppressing escape of Ni from the surface of electroless Ni plating are not sufficient, while if the P content exceeds 0.1 mass percent, the proportion of P compounds in solid phase in the solder in a molten state at 250° C. exceeds 0.2 percent, which interferes with soldering. Therefore, the added amount of P is made 0.03-0.1 mass percent. A preferred lower limit of the P content is 0.04 mass percent and a preferred upper limit thereof is 0.08 mass percent.

One or more elements selected from Ni, Cr, Fe, Mn, Co, Sb, and Ti which have an effect of increasing mechanical strength may be added to a lead-free solder used in this invention in a total amount of at most 1 mass percent. These elements which have an effect of increasing mechanical strength generally have a high melting point. Therefore, if they are added in a total of more than 1 mass percent, the liquidus temperature of the lead-free solder becomes high, and it becomes necessary to increase the soldering temperature, whereby electronic parts may undergo thermal damage.

One or more elements selected from Ag, Cu, Bi, In, Zn, Ge, and Ga which are melting point lowering elements can be added to a lead-free solder used in the present invention in a total amount of at most 15 mass percent. If more than 15 mass percent of these elements is added, the solidus temperature of the solder decreases too much, and a long time is required until molten solder solidifies at the time of soldering, thereby causing cracks to develop in soldered portions. Accordingly, the amount of these melting point lowering elements added to a lead-free solder used in the present invention is a total of at most 15 mass percent.

Preferred lead-free solder alloys used in the present invention are Sn—P—Ag alloys, Sn—P—Cu alloys, Sn—P—Ag—Cu alloys, Sn—P—Ag—Sb alloys, and Sn—P—Ag—Cu—In(—Ni) alloys. As already stated, preferred composition ranges in these alloys are Sn: at least 80 mass percent, Ni, Sb: a total of at most 1 mass percent, and Ag, Cu, and In: a total of at most 15 mass percent. Still more preferred ranges for these alloying elements are as follows:

Ag: 1-4 mass percent,
Cu: 0.1-1.0 mass percent,
Sb: 0.1-1.0 mass percent,
In: 0.1-1.0 mass percent, and
Ni: 0.015-0.2 mass percent.

In particular, in a Sn—P—Ag—Cu alloy, Ag and Cu not only have a melting point lowering effect but also exhibit the effect of suppressing growth of SnNi intermetallic compounds and exhibit a marked synergy with the effects produced by the addition of P. In addition, Ni and Sb exhibit the effect of improving resistance to thermal fatigue.

Specific examples of compositions are Sn—P—Ag/Cu based solder alloys containing P: 0.03-0.1 mass percent, Ag: 1-4 mass percent and/or Cu: 0.1-1.0 mass percent, optionally one or more of In: 0.1-1.0 mass percent and Ni: 0.015-1.0 mass percent, and a remainder of Sn.

The present invention increases bonding strength when portions plated by electroless Ni plating are soldered using a lead-free solder. The lead-free solder may have any form. When forming solder bumps on BGA or CSP substrates, solder balls are a suitable form. Preferably the solder balls have a diameter of 0.04-1.0 mm. This is because solder balls having a diameter of 0.04-1.0 mm are generally used when forming solder bumps on a BGA substrate or a CSP substrate.

In the present invention, a pull strength test is performed by soldering solder balls with a diameter of 0.76 mm to electrodes with a diameter of 0.61 mm of a BGA substrate which have been plated by electroless Ni plating with a thickness of 5 μm to form solder bumps and then pulling the solder balls which were soldered with a clamper in the direction perpendicular to the bonding surface at a lifting speed of 30 mm per second. The pull strength corresponds to the fracture strength measured in this test.

According to the present invention, in the pull strength test, the solder joint is preferably not severed, i.e., almost all the severed portions are in the solder itself, or fracture occurs in the BGA substrate. The fracture strength at this time should be at least 40 newtons (N). This is because when electronic equipment such as a mobile phone or a personal computer is dropped from a height of one meter, soldered portions in electronic parts incorporated into such electronic equipment receive a strong impact. The strength of a typical lead-free solder under these conditions is approximately 25 N, and as high a bonding strength as possible is desired. The ability to suppress peeling at the solder interface when electronic equipment receives a strong impact allows a large degree of freedom in the design of parts or in the design of the solder composition and markedly increases the reliability of the product.

In other words, the present invention is a method of bonding a solder bump exhibiting a bonding strength of at least 40 N.

EXAMPLES

In this example, electrodes of BGA substrates plated by electroless Ni plating were soldered using solder balls of lead-free solder alloys having the compositions shown in Table 1. Electroless Ni plating was carried out by a conventional method to obtain a plating thickness of 5 μm using a Ni—P plating solution containing nickel sulfate as a Ni source and sodium hypophosphite as a reducing agent.

A pull strength test was carried out on the resulting solder joints to determine the pull strength. The results are shown in Table 1.

TABLE 1

| | | Lead-free solder composition (mass %) | | | | Pull test | |
|---|---|---|---|---|---|---|---|
| | | | | | | Pull strength | Peeling |
| | | Sn | P | Ag | Cu Other | (N) | rate (%) |
| Preferred | 1 | rem | 0.03 | 1 | 0.5 | 45.19 | 6 |
| Solders | 2 | rem | 0.05 | 1 | 0.5 | 44.82 | 4 |
| | 3 | rem | 0.1 | 1 | 0.5 | 45.99 | 2 |
| | 4 | rem | 0.03 | 4 | 0.5 | 45.08 | 6 |
| | 5 | rem | 0.1 | 4 | 0.5 | 50.03 | 2 |
| | 6 | rem | 0.03 | 4 | 0.5 | 48.74 | 6 |
| | 7 | rem | 0.1 | 4 | 0.5 | 49.66 | 5 |
| | 8 | rem | 0.05 | 3 | 0.5 | 45.45 | 5 |
| | 9 | rem | 0.05 | 3.5 | | 44.41 | 5 |
| | 10 | rem | 0.05 | 3 | | 45.59 | 5 |
| | 11 | rem | 0.05 | | 1 | 42.1 | 0 |
| | 12 | rem | 0.05 | 3 | 1  0.1 In | 44.67 | 0 |
| | 13 | rem | 0.05 | 3 | 0.5  0.1 Ni | 49.05 | 5 |
| | 14 | rem | 0.05 | 3 | 0.5 Sb | 47.1 | 0 |
| Others | 1 | rem | | 1 | | 23.86 | 100 |
| | 2 | rem | 0.001 | 1 | | 24.03 | 100 |
| | 3 | rem | 0.01 | 1 | | 32.55 | 70 |
| | 4 | rem | 0.02 | 1 | | 38.37 | 62 |
| | 5 | rem | | 4 | 0.5 | 26.01 | 100 |

Measurement of the pull strength and determination of the peeling rate in this example were carried out as follows.

Measurement of Pull Strength (N)

Figure 3:
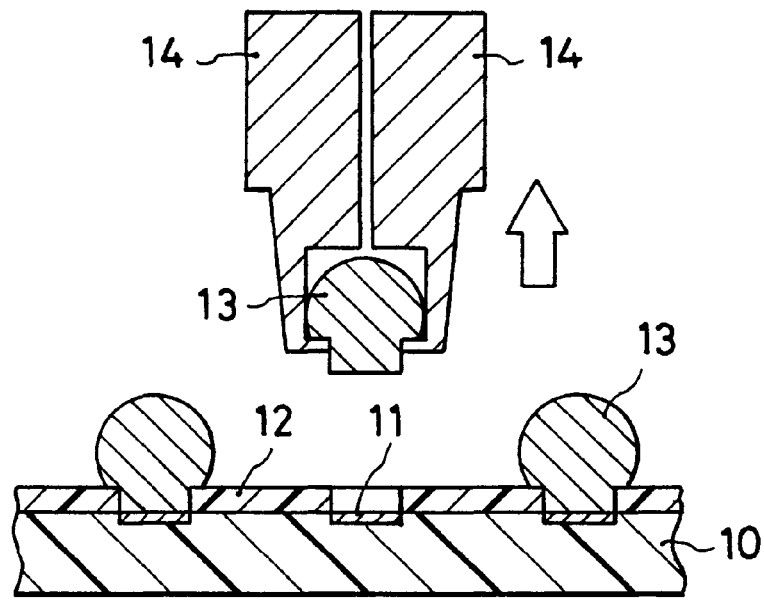
FIG. 3 is a schematic explanatory view showing the state in which a solder bump peels off from the junction with an electrode in a pull strength test.

As shown in FIG. 3, circular electrodes 11 were formed on a BGA substrate 10, and the periphery thereof was covered with a resist 12. Solder balls having a larger diameter than the electrodes were soldered to the electrodes 11 and formed into solder bumps 13. A solder bump 13 formed on an electrode 11 of the BGA substrate 10 was gripped between a pair of dampers 14, 14 and pulled upwards at a high speed to peel the solder bump 13 from the electrode 11, and the pull strength (N) at this time was measured. In this pull strength test, the average value for 50 electrodes of the pull strength of a lead-free solder used in the present invention was at least 40 N. The measurement conditions at this time were as follows.

Solder balls: 0.76 mm in diameter
Electrodes: 0.61 mm in diameter
Lifting speed: 30 mm per second Determination of Peeling Rate When solder bumps were peeled off the electrodes in the pull strength test, the case shown in FIG. 3 in which a solder bump 13 peeled from the juncture with an electrode 11 was referred to as Mode A. In Mode A, a thick layer of SnNi intermetallic compounds developed in the interface of the solder joint, and a thick P layer remained in the surface of electroless Ni plating layer. Peeling took place in the interface, which is not a desirable state of peeling.

Figure 4:
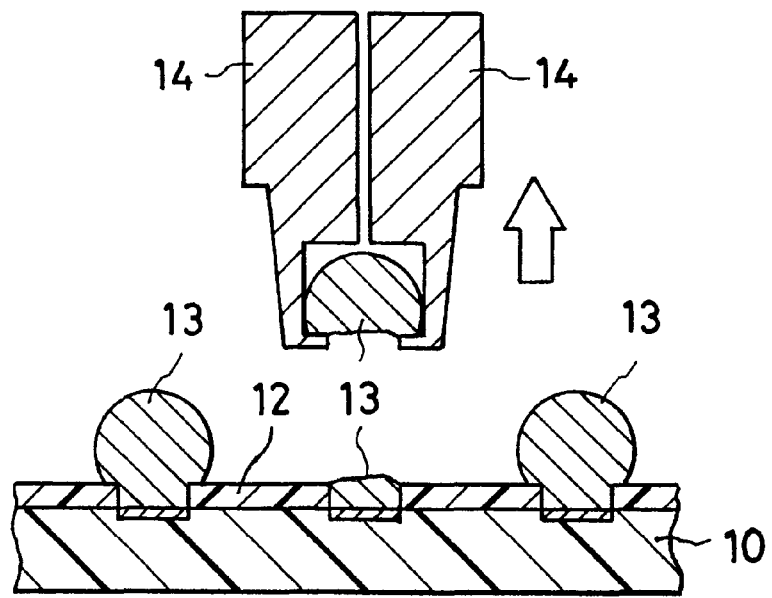
FIG. 4 is a schematic explanatory view showing the state in which the solder bump itself fractures in the test.

FIG. 4 shows another mode of peeling referred to as Mode B in which peeling occurred in the middle of the solder bump 13, i.e., the solder itself broke. In Mode B, the bonding strength of the solder joint was stronger than the bump itself, making this a preferred fracture mode.

Figure 5:
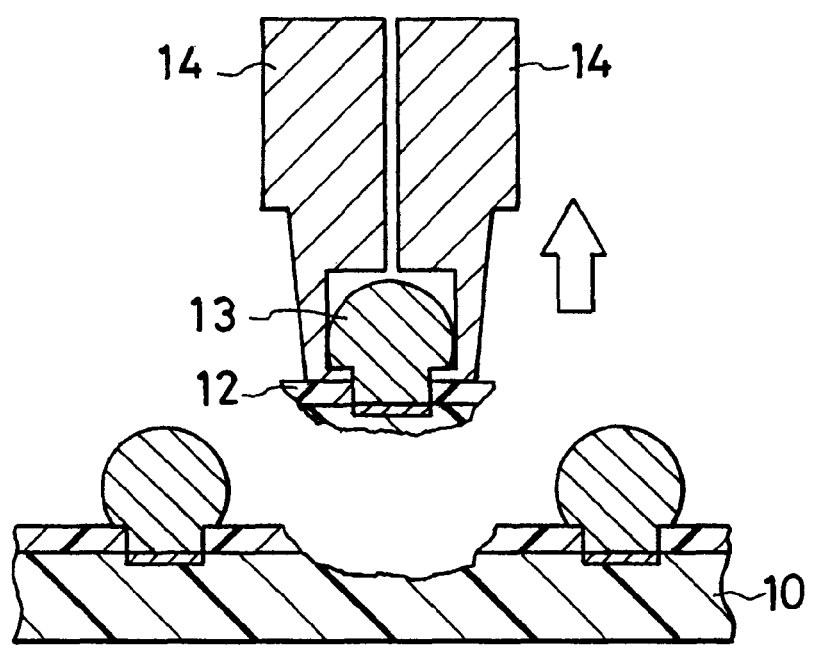
FIG. 5 is a schematic explanatory view showing the state in which an electrode breaks away together with a substrate in the test.

FIG. 5 shows Mode C in which the electrode and the solder bump together peeled off the substrate. In Mode C, the solder joint was stronger than the joint between the electrode and the substrate, making it a preferred peeling mode.

The peeling rate (among 50 samples) is calculated by the following equation. This value must be 10% or less. The peeling rate for a lead-free solder used in the present invention is 10% or less.

Peeling rate=100×*A*/(*A+B+C*)

(A, B, and C=number of occurrences of peeling in each mode; A+B+C=50)

As can be seen from Table 1, BGA substrates formed using solder bumps of a preferred lead-free solder containing 0.03-0.1 mass percent of P had joints with excellent bonding strength, and the peeling rate was always 10% or less, so they had excellent reliability. In contrast, the bonding strength of the BGA substrates formed with solder bumps of a lead-free solder having a P content of less than 0.03 mass percent or a lead-free solder not containing any P at all was low, and peeling took place easily, with a peeling rate of at least 60%.

FIG. 2 is an electron photomicrograph of a joint formed when a portion plated by electroless Ni plating was soldered using the lead-free solder (Sn-0.03P-4Ag-0.5Cu) of preferred solder No. 6 of Table 1. Ni plating 1 was applied by the electroless plating method to the surface of an unillustrated Cu electrode on a BGA substrate. A solder ball of a Sn-0.03P-4Ag-0.5Cu lead-free solder was soldered atop the Ni plating to form a solder bump 2. In the joint between the electroless Ni plating 1 and the solder bump 2, a SnNi intermetallic compound 3 was formed which was thinner than the SnNi intermetallic compound layer 4 formed when soldering using the above-described Sn-4Ag-0.5Cu lead-free solder not containing P. P which remained due to diffusion of Ni in the electroless Ni plating layer was present below the intermetallic compound layer as a P layer 4 which is also thinner than in the case of the above-mentioned lead-free solder. This result shows that in the present invention, there is little growth of brittle SnNi intermetallic compounds, and a brittle P layer between the intermetallic compounds and the electroless Ni plating becomes extremely thin. Therefore, a high bonding strength is obtained.

Industrial Applicability

The present invention was explained with respect to a method of soldering to electrodes of a BGA substrate plated by electroless Ni plating. However, the present invention can be applied not only to BGA substrates but also to CSP's and MCM's which are soldered using lead-free solder balls, as well as to any soldered portions plated by electroless Ni plating.

The invention claimed is:

1. A soldering method comprising performing soldering of a solder ball which has a diameter of 0.04-1.0 mm and is made from a lead-free solder consisting of Ag: 1.0-4.0 mass percent, Cu: 0.1-1.0 mass percent, P: 0.03-0.08 mass percent, Ni: 0-1 mass percent, In: 0-15 mass percent, and a remainder of Sn to a plated portion which is plated by electroless Ni plating to form a solder bump and a SnNi intermetallic compound layer between the solder bump and the plated portion, the SnNi intermetallic compound layer having a thickness of at most 0.5 μm.

2. A soldering method as claimed in claim 1 wherein the solder contains Ni and has an Ni content of at most 1 mass percent.

3. A soldering method as claimed in claim 1 wherein the solder contains 0.015-0.2 mass percent of Ni.

4. A soldering method as claimed in claim 1 wherein the solder contains In and has an In content of at most 15 mass percent.

5. A soldering method as claimed in claim 1 wherein the solder contains 0.1-1.0 mass percent of In.

6. A soldering method as claimed in claim 1 wherein the solder contains 0.1-1.0 mass % of In and 0.015-0.2 mass percent of Ni.

7. A soldering method as claimed in claim 1 wherein when the solder ball has a diameter of 0.76 mm and the solder bump is formed on an electrode of a BGA substrate having a diameter of 0.61 mm by soldering the solder ball to the electrode which has been plated by electroless Ni plating with a thickness of 5 μm and the solder bump is subjected to a pull strength test, the bonding strength of a soldered joint formed between the solder bump and the electrode is such that fracture does not occur in an interface between the solder bump and the electrode.

8. A soldering method as claimed in claim 1 wherein the solder bump has a bonding strength of at least 40 N in a pull strength test.

9. A soldering method as claimed in claim 1 wherein the solder contains 0.04-0.08 mass percent of P.

10. A soldering method as claimed in claim 1 wherein the plated portion comprises an electrode of a BGA substrate.

11. A soldering method as claimed in claim 1 wherein the solder ball has a diameter of 0.04-0.76 mm.

12. A soldering method as claimed in claim 3 wherein the solder contains greater than 0.05 to 0.08 mass percent of P.

13. A soldering method as claimed in claim 6 wherein the solder contains greater than 0.05 to 0.08 mass percent of P.

* * * * *